United States Patent [19]
Siniscalchi et al.

[11] Patent Number: 6,046,875
[45] Date of Patent: Apr. 4, 2000

[54] LINEAR TRANSCONDUCTANCE CIRCUIT HAVING A LARGE LINEAR RANGE

[75] Inventors: Patrick P. Siniscalchi, Sachse; Davy H. Choi, Garland, both of Tex.; Sen-Jung Wei, Cupertino, Calif.

[73] Assignee: Texas Instruments Incorporated, Dallas, Tex.

[21] Appl. No.: 08/996,980

[22] Filed: Dec. 23, 1997

[51] Int. Cl.[7] ..................................................... G11B 5/02
[52] U.S. Cl. ............................... 360/67; 360/65; 360/46; 330/260; 327/103
[58] Field of Search ................................ 360/46, 67, 65; 330/260; 327/103

[56] References Cited

U.S. PATENT DOCUMENTS

| 5,606,288 | 2/1997 | Prentice | 330/260 |
| 5,648,738 | 7/1997 | Welland et al. | 360/46 |
| 5,821,810 | 10/1998 | Swart et al. | 360/67 |

Primary Examiner—W. Chris Kim
Attorney, Agent, or Firm—W. Daniel Swayze, Jr.; Wade James Brady, III; Frederick J. Telecky, Jr.

[57] ABSTRACT

A method for generating a response in a transconductance circuit includes receiving a circuit differential voltage input and providing a differential voltage input to each of a plurality of differential pairs to control, in part, a differential current generated by each differential pair. Each differential voltage input has a different common-mode voltage level. The method also includes sinking current through each of the differential pairs to control the differential current generated by each differential pair. The magnitude of the current sunk through one of the differential pairs is different from the magnitude of the current sunk through at least one of the other differential pairs. The method also includes combining the generated differential current from each of the plurality of differential pairs to produce a differential current output. Such a method may be used to generate a response in a transconductance circuit that is fairly linear over a range of input voltages without reducing the bandwidth of the transconductance circuit.

20 Claims, 2 Drawing Sheets

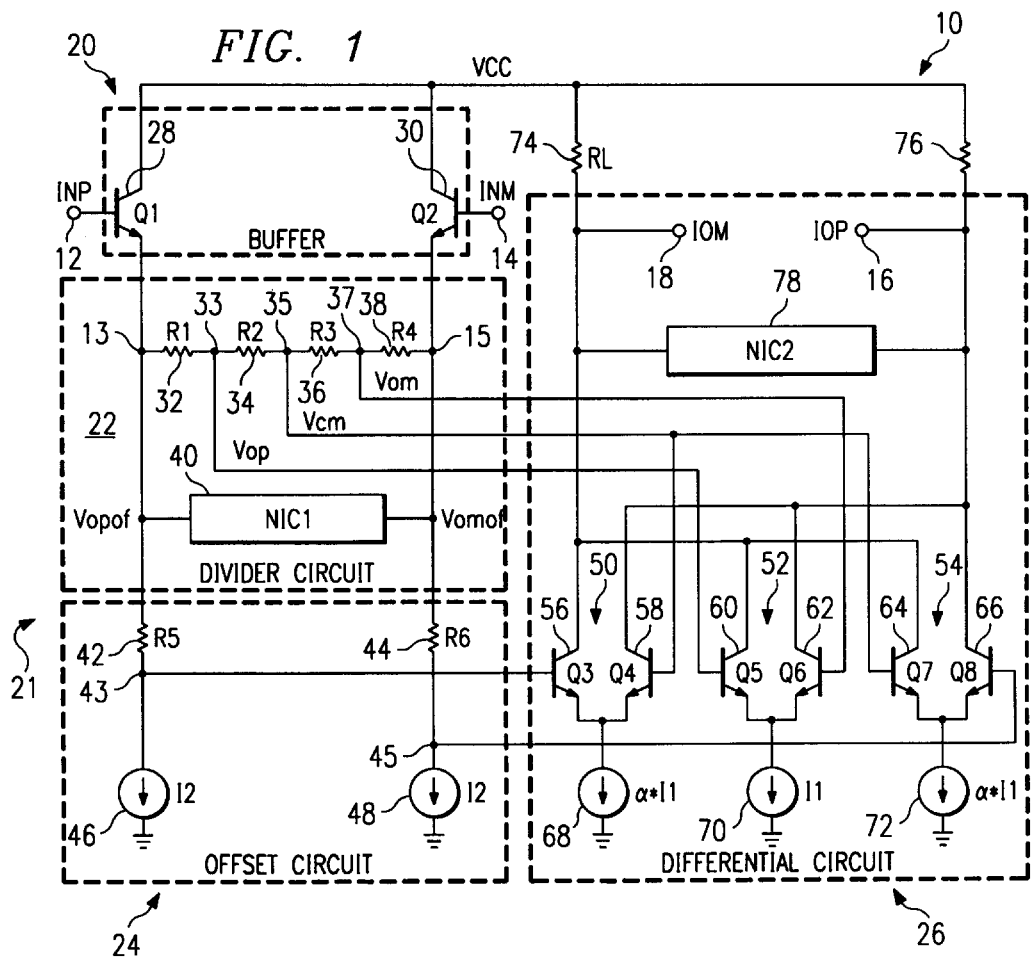

LINEAR TRANSCONDUCTANCE CIRCUIT HAVING A LARGE LINEAR RANGE

TECHNICAL FIELD OF THE INVENTION

This invention relates in general to the field of electronics, and more particularly to a linear transconductance circuit.

BACKGROUND OF THE INVENTION

Hard disk drives include a variety of electronic circuitry for processing data and for controlling the overall operation. This electronic circuitry generally includes a preamplifier, a read channel, a write channel, a servo controller, a motor control circuit, read-only memory (ROM), a random-access memory (RAM), and a variety of disk control circuitry to control the operation of the hard disk drive and to properly interface the hard disk drive to a system bus. A separate microprocessor is also generally provided for executing instructions to control the operation of the HDD.

Read channel integrated circuits for hard-disk drive digital magnetic recording channels require a programmable low-pass filter circuit for reducing wideband noise and shaping a readback signal. The low-pass filter is built from a number of tunable transconductance stages. Although a transconductance stage utilizing bipolar transistors can operate at higher frequency ranges than a transconductance stage utilizing MOSFETS and can provide higher transconductance, bipolar transconductance stages of high frequency filters have inherently small linear ranges, which reduces the amplitude of the signal that can be passed through the filter. This small linear range results in lower signal-to-noise performance in the read channel.

Some attempts at increasing the linear range of bipolar transconductance stages have utilized intentional device area offsets. However, affecting the linearity of such devices results in bandwidth degradation due to the use of larger device sizes to effect a device area offset. Generally, the use of larger devices results in diminished frequency response.

SUMMARY OF THE INVENTION

From the foregoing it may be appreciated that a need has arisen for a linear transconductance circuit that provides a greater linear range than prior devices without suffering bandwidth degradation. In accordance with the present invention, a transconductance circuit is provided that addresses the disadvantages and problems outlined above.

According to the present invention, a transconductance circuit for providing an approximate linear response includes a differential input operable to receive a transconductance circuit differential input voltage and a differential output operable to receive a transconductance circuit differential output current. The transconductance circuit also includes a first, a second, and a third differential pair. Each differential pair is operable to receive a differential voltage and is connected to a current sink. The current sink connected to the first differential pair is operable to sink a current having a magnitude that is different from the magnitude of the current sunk by the current source connected to the second differential pair and the current sink connected to the first differential pair is also different from the magnitude of the current sunk by the current source connected to the third differential pair. The transconductance circuit also includes an offset and divider circuit operable to receive a differential voltage indicative of the transconductance circuit differential input voltage and in response provide a first differential voltage to the first differential pair, a second differential voltage to the second differential pair, and a third differential voltage to the third differential pair. The first, second, and third differential voltages each have different common-mode levels. The first, second, and third differential pairs produce the transconductance circuit differential output current at the differential output in response to receiving the first, second, and third differential voltages, respectively.

According to another aspect of the present invention, a method for generating a response in a transconductance circuit includes receiving a circuit differential voltage input and providing a differential voltage input to each of a plurality of differential pairs to control, in part, a differential current generated by each differential pair. Each differential voltage input has a different common-mode voltage level. The method also includes sinking current through each of the differential pairs to control the differential current generated by each differential pair. The magnitude of the current sunk through one of the differential pairs is different from the magnitude of the current sunk through at least one of the other differential pairs. The method also includes combining the generated differential current from each of the plurality of differential pairs to produce a circuit differential current output.

The present invention provides numerous technical advantages. For example, a technical advantage of the present invention is that a relatively large linear range may be obtained. A larger linear range allows for a larger filtered signal, which reduces the signal-to-noise ratio of an associated filter. Reduction of the signal-to-noise of a filter is desirable. The increased linear range may be obtained with the use of small devices. Because small devices may be used, the resulting filter has improved bandwidth. In addition, the transconductance of a transconductance stage according to the invention is relatively temperature independent. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which:

FIG. 1 is a circuit diagram of a linear transconductance circuit according to the teachings of the present invention;

FIG. 2 is a graph of transconductance versus differential input voltage for one example of the linear transconductance circuit illustrated in FIG. 1;

DETAILED DESCRIPTION OF THE INVENTION

Figure 3:
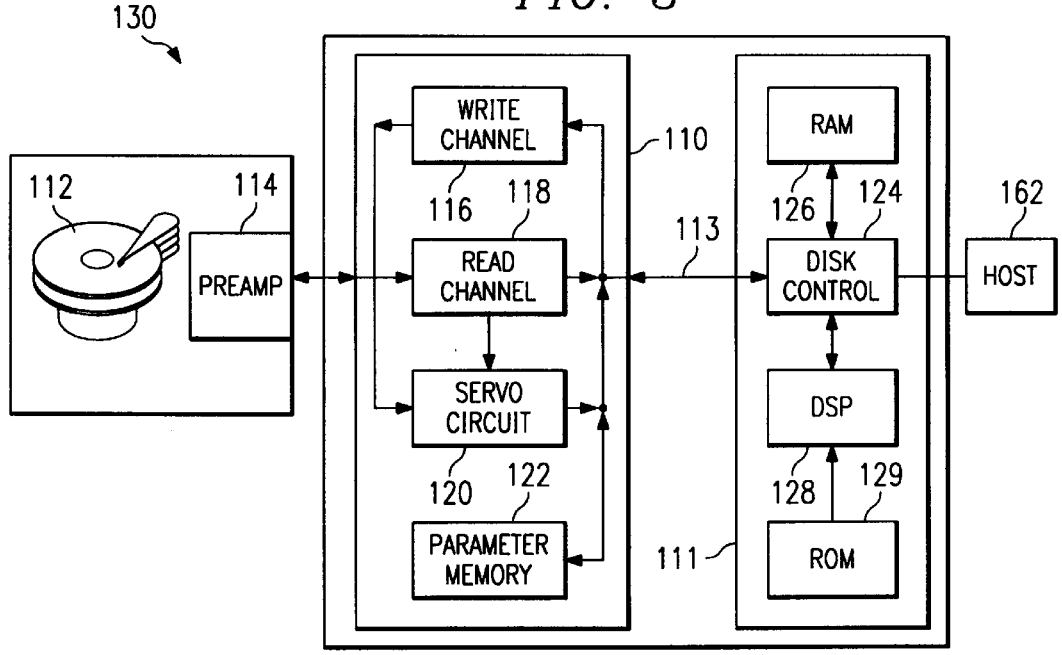
FIG. 3 is a block diagram of a disk drive mass storage system incorporating a transconductance circuit according to the teachings of the present invention.

Embodiments of the present invention and their advantages are best understood by referring to FIGS. 1 through 4 of the drawings, like numerals being used for like and corresponding parts of the various drawings.

FIG. 1 is a circuit drawing of a linear transconductance circuit 10 according to the teachings of the present invention. Linear transconductance circuit 10 includes a differential input pair comprising a first voltage input node 12 and a second voltage input node 14. Linear transconductance circuit 10 also includes a differential current output pair comprising a first current output node 16 and a second current output node 18. Linear transconductance circuit 10 receives a differential voltage input at first input voltage input node 12 and second voltage input node 14 and produces a differential current at first current output node 16 and second current output node 18. The transconductance of linear transconductance circuit 10 is defined as the change in differential output current divided by the change in differential input voltage and may be written as $$G_m = \frac{\Delta(I_{16} - I_{18})}{\Delta(V_{12} - V_{14})}$$

where:
  $G_m$=transconductance of linear transconductance circuit 10
  $V_{12}$=an input voltage applied at first input voltage node 12;
  $V_{14}$=an input voltage applied at second input node 14;
  $I_{16}$=an output current through first current output node 16; and
  $I_{18}$=an output current through first current at output node 18.

According to the teachings of the present invention, the transconductance, $G_m$ of linear transconductance circuit 10 is fairly constant over a wide range of differential input voltages applied at first voltage input node 12 and second voltage input node 14. Such a characteristic is referred to as a linear response, which is desirable because a large linear range allows for a larger input signal, which reduces signal-to-noise ratios in devices such as filters. A filter is one example of a use for linear transconductance circuit 10.

Linear transconductance circuit 12 includes a buffer 20, an offset and divider circuit 21, and a differential circuit 26. Offset and divider circuit 21 comprises a divider circuit 22 and an offset circuit 24.

Buffer circuit 20 buffers a differential voltage input applied at first voltage input node 12 and second voltage input node 14 to nodes 13 and 15, respectively. In the embodiment illustrated in FIG. 1, buffer 20 includes an NPN bipolar transistor 28 having a base connected to first voltage input node 12 and an NPN bipolar transistor 30 having a base connected to second voltage input node 14. Buffer 20 therefore isolates portions of linear transconductance circuit 10 from adjacent circuits.

Divider circuit 22 receives the buffered differential input voltages at nodes 13 and 15. Divider circuit 22 includes a number of resistance elements including resistor 32, resistor 34, resistor 36, and resistor 38. In the embodiment illustrated in FIG. 1, resistors 32, 34, 36, and 38 divide the buffered differential input voltages at nodes 13 and 15 and, in cooperation with offset circuit 24, provide selected differential voltages to differential circuit 26. According to one embodiment, resistors 32, 34, 36, and 38 have the same resistance. The providing of differential voltages to differential circuit 26 is described in greater detail below.

Divider circuit 22 also includes a negative impedance converter 40 across nodes 13 and 15. Negative impedance converter 40 serves to counteract the input impedance reducing effect of resistors 32, 34, 36 and 38. Therefore, linear transconductance circuit 10 maintains a high input impedance even in light of providing resistors 32, 34, 36 and 38 between nodes 13 and 15.

Offset circuit 24 receives the buffered differential input circuit from nodes 13 and 15 and produces an offset voltage drop. In addition, offset circuit 24 cooperates with divider circuit 22 to provide differential voltages to portions of differential circuit 26. Such an offset voltage drop is effected through current sinks 46 and 48 and resistors 42 and 44.

Current sinks 46 and 48 each sink a current $I_2$. Therefore, the voltage drop across resistor 42 is equal to $I_2$ times the resistance of resistor 44 and the voltage drop across resistor 42 is equal to $I_2$ times the resistance of resistor 44. According to one embodiment, resistors 42 and 44 have the same resistance. Current sinks 46 and 48 may produce a current $I_2$ that is inversely proportional to the resistance of resistors 42 and 44. Therefore, a constant voltage drop may be achieved across resistors 42 and 44.

The purpose of dropping a voltage across resistors 42 and 44 is to offset the common-mode voltage of a differential voltage signal applied to portions of differential circuit 26, which is described in greater detail below.

Differential circuit 26 includes a plurality of emitter-coupled differential pairs 50, 52, and 54. Differential pair 50 includes an NPN bipolar transistor 56 and an NPN bipolar transistor 58; however, other suitable types of transistors may be used. Connected to the emitters of transistors 56 and 58 is a current sink 68. Current sink 68 sinks a current equal to $\alpha I_1$. The collector of transistor 56 is connected to second current output node 18 and the collector of transistor 58 is connected to first current output node 16. Differential pair 50 produces a differential current at the collectors of transistors 56 and 58, which is provided to first and second output nodes 16 and 18. The magnitude of the differential current produced by differential pair 50 is controlled by current sink 68 and by voltages applied at the bases of transistors 56 and 58. The operation of an emitter-coupled differential pairs, such as differential pairs 50, 52, and 54 is described in greater detail in *Microelectronics*, Millman, Jacob and Grabel, Arvin, McGraw-Hill Book Company, 1977, second edition, pp. 251–253, which is incorporated herein by reference.

Connected to the base of transistor 56 is a node 43 in offset circuit 24. During operation, node 43 retains a voltage that is equal to the buffered input voltage at node 13 minus the voltage drop across resistor 42 due to current source 46. Connected to the base of transistor 58 is node 35 of divider circuit 22. During operation, node 35 retains a voltage that is between the buffered input voltages at node 13 and node 15. In the embodiment in which resistors 32, 34, 36, and 38 have the same resistance, node 35 retains the common-mode voltage of the buffered voltages at nodes 13 and 15. This common-mode voltage is approximately equal to the common-mode voltage of the differential voltage input signal applied at input voltage nodes 12 and 14 minus the base to emitter voltage drops of transistors 28 and 30, respectively.

Thus, during operation differential pair 50 has a differential voltage input applied at the bases of transistors 56 and 58 equal to the differential voltage between nodes 43 and 35. This differential input voltage and current sink 68 determine the amount of differential current generated by differential pair 50 and provided to first and second current output nodes 16 and 18.

Differential pair 54 includes an NPN bipolar transistor 64 and an NPN bipolar transistor 66; however, other suitable types of transistors may be used. The emitters of transistors 64 and 66 are each connected to a current sink 72 that sinks a current $\alpha I_1$. Although the illustrated embodiment utilizes current sinks 68 and 72 that sink the same amount of current, other suitable magnitudes for current sinks 68 and 72 may be utilized. Transistor 64 has its collector connected to second current output node 18 and transistor 66 has its collector connected to first current output node 16. Differential pair 54 produces a differential current at the collectors of transistors 64 and 66, which is provided to first and second output nodes 16 and 18.

Connected to the base of transistor 66 is a node 45 in offset circuit 24. During operation, node 45 retains a voltage that is equal to the buffered input voltage at node 15 minus the voltage drop across resistor 44 due to current source 48. Connected to the base of transistor 64 is node 35 of divider circuit 22, which is also connected to the base of transistor 58 in differential pair 50 as described above. Thus, during operation differential pair 54 has a differential voltage input applied at the bases of transistors 64 and 66 that is equal to the differential voltage between nodes 35 and 45. This differential input voltage and current sink 72 determine the amount of differential current generated by differential pair 54 and provided to first and second current output nodes 16 and 18.

Differential pair 52 includes an NPN bipolar transistor 60 and an NPN bipolar transistor 62; however, other suitable types of transistors may be used. Transistors 60 and 62 each have emitters connected to a current sink 70. Current sink 70 sinks a current $I_1$. Transistor 60 has its collector connected to second current output node 18 and transistor 62 has its collector connected to first current output node 16. Differential pair 52 produces a differential current at the collectors of transistors 60 and 62, which is provided to first and second output nodes 16 and 18.

Connected to the base of transistor 60 is a node 33 in offset circuit 24. During operation, node 33 retains a voltage that is equal to the buffered input voltage at node 13 minus a voltage drop across resistor 32. Connected to the base of transistor 62 is node 37 of divider circuit 22. During operation, node 37 retains a voltage that is equal to the buffered input voltage at node 15 plus a voltage gain across resistor 38. In an embodiment in which resistors 32, 34, 36, and 38 are equal, the common-mode voltage of the differential voltages applied to transistors 60 and 62 is approximately equal to the common-mode voltage of the differential voltage input applied at voltage input nodes 12 and 14 minus the base to emitter voltage drops of transistors 28 and 30, respectively. Thus, during operation differential pair 52 has a differential voltage input applied at the bases of transistors 60 and 62 that is equal to the differential voltage between nodes 33 and 37. This differential input voltage and current sink 70 determine the amount of differential current generated by differential pair 52 and provided to first and second current output nodes 16 and 18.

Differential circuit 26 also includes a pair of load resistors 74 and 76 connected between second current output node 18 and first current output node 16. To provide a high output impedance, a negative impedance converter 78 may be applied across second current output node 18 and first current output node 16.

In operation, linear transconductance circuit 10 receives a differential voltage input at first voltage input node 12 and second voltage input node 14. This differential voltage is buffered to nodes 13 and 15.

Resistors 32, 34, 36, and 38 of divider circuit 22 divide the buffered differential voltage at nodes 13 and 15 and provide selected voltages at nodes 33 and 37 to the base of transistors 60 and 62 in differential pair 52, respectively. The differential voltage between the bases of transistors 60 and 62 and the current sunk by current source 70 controls the amount of emitter current generated by differential pair 52. This emitter current generated by differential pair 52 is provided to first and second current output nodes 16 and 18.

Resistors 32, 34, 36, and 38 also produce a voltage at node 35. The voltage at node 35 is provided to the bases of transistors 58 and 64. If resistors 32, 34, 36, and 38 have the same resistance, the voltages at the bases of transistors 58 and 64 are approximately equal to the common-mode voltage of the differential input voltage applied at voltage input nodes 12 and 14 minus the base to emitter voltage drops of transistors 28 and 30, respectively. The voltage at the base of transistor 58 comprises one-half of the differential voltage that helps control differential pair 50 and the voltage at the base of transistor 64 comprises one half of the differential voltage that helps control differential pair 54. The other half of each of these differential voltages is provided by offset circuit 24.

The buffered differential input voltage at nodes 13 and 15 is received by offset circuit 22. Resistor 42, in combination with current sink 46, produces a voltage drop resulting in a voltage at node 43. The voltage at node 43 is provided to the base of transistor 56 in differential pair 50 and provides the second half of differential voltage that helps control differential pair 50. Similarly, a voltage drop across resistor 44 due to current $I_2$ produced by current sink 48 results in a voltage at node 45. The voltage at node 45 is applied to the base of transistor 66 in differential pair 54 and provides the second half of the differential voltage that helps control differential pair 54.

Differential pairs 50 and 54 therefore have differential input voltages that each have a common mode that is offset from the common-mode voltage of differential pair 52. If the resistances of resistors 42 and 44 are equal and the resistance of resistors 32, 34, 36, and 38 are equal, differential pairs 50 and 54 have differential voltages having common-mode voltages with equal and opposite offsets from the common-mode voltage applied at differential pair 52. These offsets of common-mode voltages help produce a fairly constant transconducatnce for linear transconductance circuit, as described in greater detail in conjunction with FIG. 2.

Differential pairs 50, 52, and 54 then each produce a differential current that is summed and provided to first and second current output nodes 16 and 18. The magnitude of the differential current produce by each of differential pairs 50, 52, and 54 is controlled, in part, by the differential voltages applied to each differential pair. Also affecting the current produce by each differential pair is the magnitude of current sunk by current sinks 68, 70, and 72.

According to one embodiment, current sinks 68 and 72 each sink the same amount of current and the amount of current that is sunk by each of sinks 68 and 72 is greater than the amount of current sunk by current sink 70. Proper proportioning of current sinks 68 and 72 with current sink 70 allows a fairly constant transconductance for linear transconductance circuit 10 over a range of differential input voltages applied at voltage input nodes 12 and 14. Proper proportioning of current sinks 68 and 72 with current sink 70 is described in greater detail below in conjunction with FIG. 2. According to one embodiment, a is greater than 1. If $\alpha$ is greater than 1 the transconductance of differential pairs 50 and 54 is greater than the transconductance of differential pair 52. This characteristic is illustrated in FIG. 2.

FIG. 2 illustrates a graph of the transconductance of linear transconductance circuit 10 for a range of differential voltage inputs applied at first voltage input node 12 and second voltage input node 14. FIG. 2 includes curves 80, 82, 84, and 86. These curves correspond to the following values for linear transconductance circuit 10. Resistors 32, 34, 36, and 38 are equal and have a resistance of 700 ohms each. Resistors 42 and 44 are equal and have a resistance of 500 ohms each. Resistors 74 and 76 are equal and have a resistance of 4 kilohms each. Current sinks 68 and 72 are equal and produce a current of 26.4 µA. Current sink 70 produces a current of 20 µA, which provides a value of 1.32 for α. Current sinks 46 and 48 are equal and produce a current of 150 µA.

Curve 80 represents the transconductance of differential pair 54, curve 82 represents the transconductance of differential pair 52, and curve 84 represents the transconductance of differential pair 50. The transconductance of linear transconductance circuit 10, which equals the sum of the transconductance of differential pair 50, differential pair 52, and differential pair 54, is represented by curve 86.

Curves 80 and 84 are greater in magnitude than curve 82 because of the greater current sunk by current sinks 68 and 72 through differential pairs 50 and 54. The relative magnitude of curves 80, 82, and 84 may be adjusted by varying the proportionality constant α. The greater the value for α, the greater the vertical distance between curves 80 and 82 and the greater the vertical distance between curves 82 and 84.

Curves 80, 82, and 84 are also offset horizontally due to divider circuit 22 and offset circuit 24. In the example illustrated in FIG. 2, the voltage applied to the base of transistor 64 in differential pair 54 is the common-mode voltage of the buffered differential input voltage at nodes 13 and 15 and the voltage applied to the base of transistor 66 in differential pair 54 is the input voltage at node 45, which is the voltage applied at node 15 minus the voltage drop across resistor 44. In this example, the voltage at node 45 is approximately 80 millivolts lower than the voltage at node 15, which corresponds to one-half of the horizontal offset between curve 84 and curve 82. Similarly, the voltage drop across resistor 42 that generates the voltage at node 43 is approximately 80 millivolts, which corresponds to approximately one-half the horizontal offset between curve 80 and 82. Thus, offset circuit 24 serves to offset the transconductance versus differential input voltage curves for differential pair 50 and differential pair 54, respectively.

By offsetting curves 80 and 84 with respect to curve 82, both horizontally and vertically, a transconductance curve 86 with a flat region corresponding to a constant transconductance over a wide range of differential input voltages may be generated. Such a constant transconductance corresponds to a transconductance circuit with a large linear response range. This larger range allows for accepting a larger signal, which reduces the signal-to-noise ratio of linear transconductance circuit 10. It should be noted that such a linear range may be obtained without the use of intentional device size offsets, which would decrease the circuit bandwidth. Thus, the invention provides a transconductance circuit with a larger linear range that does not suffer decreased bandwidth.

Figure 4:
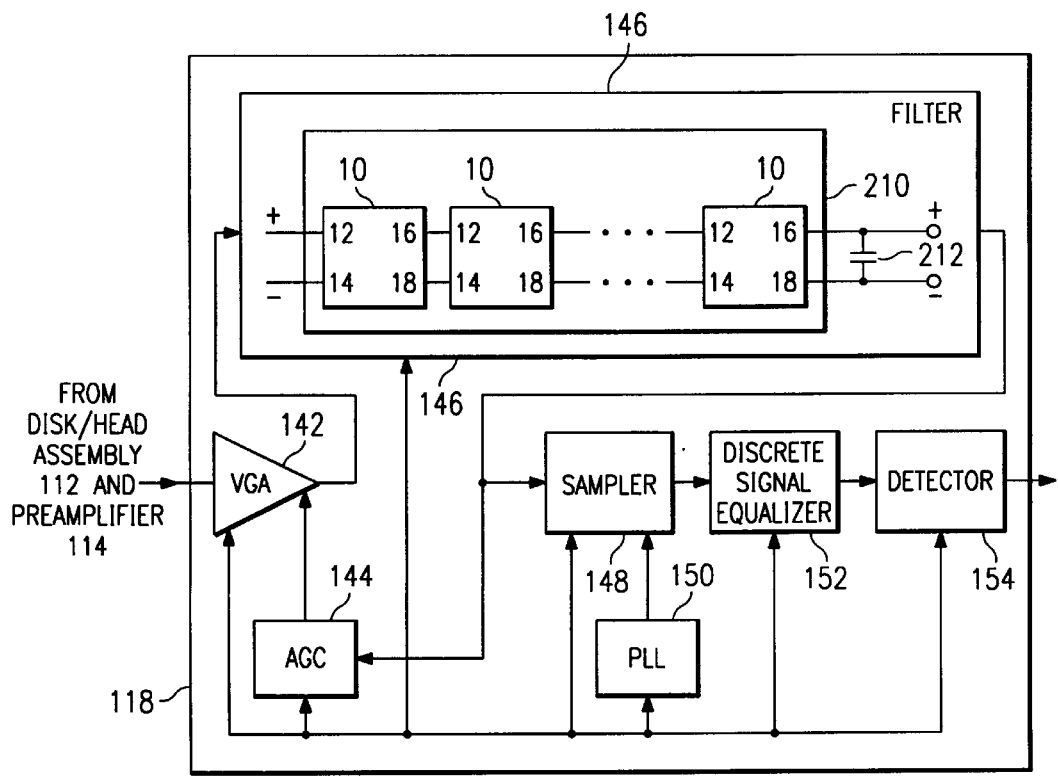
FIG. 4 is a block diagram illustrating a read channel of the disk drive mass storage system illustrated in FIG. 3 incorporating a transconductance circuit according ot the teachings of the invention.

Linear transconductance circuit 10 may be used in variety of application; however, one application for which linear transconductance circuit 10 is particularly suited is in a filter in a read channel of a disk drive mass storage system. FIGS. 3 and 4 illustrate the use of linear transconductance circuit 10 in a filter in a read channel of a disk drive mass storage system.

FIG. 3 is a block diagram of a disk drive mass storage system 130 which is used for retrieving data during read operations and for storing data during write operations. Disk drive mass storage system 130 interfaces with a host 132 to exchange digital data during both read and write operations.

Disk drive mass storage system 130 includes a disk/head assembly 112, a preamplifier 114, a synchronously sampled data (SSD) channel 110, and a control circuitry 111. Disk/head assembly 112 and preamplifier 114 are used to magnetically store data. SSD channel 110 and control circuitry 111 are used to process data that is being exchanged with disk/head assembly 112 and to control the various operations of disk drive mass storage system 130. Host 132 exchanges digital data with disk drive mass storage system 130 through control circuitry 111.

Disk/head assembly 112 includes a number of rotating magnetic disks or platters used to store data that is represented as magnetic transitions on the magnetic platters. The read/write heads of disk/head assembly 112 are used to store and retrieve data from each side of the magnetic platters. The read/write heads may be any number of available read/write heads such as magneto-resistive heads. Preamplifier 114 interfaces between the read/write heads of disk/head assembly 112 and SSD channel 110 and provides amplification to the analog data signals as needed.

SSD channel 110 is used during read and write operations to exchange analog data signals with disk/head assembly 112 and to exchange digital data signals with control circuitry 111 through a data/parameter path 113. SSD channel 110 includes a write channel 116, a read channel 118, a servo circuit 120, and a parameter memory 122. SSD channel 110 may be implemented as a single integrated circuit or as multiple integrated circuits.

During write operations, write channel 116 receives digital data from control circuitry 111 in parallel format through data/parameter path 113. The digital data is encoded for storage and provided to disk/head assembly 112. Write channel 116 may include a register, a scrambler, an encoder, a precoder, a serializer, and a write precompensation circuit. The operation and timing of write channel 116 is controlled by a phase locked loop system.

During read operations, read channel 118 receives analog data signals from disk/head assembly 112 through preamplifier 114. Read channel 118 conditions, detects, decodes, and formats the analog data signal and ultimately provides a corresponding digital data signal in parallel format to control circuitry 111 through data/parameter path 113. Read channel 118 is described in greater detail in conjunction with FIG. 4.

Control circuitry 111 is used to control the various operations of disk drive mass storage system 130 and to exchange digital data with SSD channel 110 and host 132. Control circuitry 111 includes a microprocessor 128, which may be implemented as a digital signal processor (DSP), a disk control 124, a random-access memory (RAM) 126, and a read-only memory (ROM) 129. Microprocessor 128, disk control 124, RAM 126, and ROM 129 together provide control and logic functions to disk drive mass storage system 130 so that data may be received from host 132, stored, and later retrieved and provided back to host 132. ROM 129 stores preloaded microprocessor instructions for use by microprocessor 128 in operating and controlling disk drive mass storage system 130. ROM 129 may also store the operational parameters that are supplied to parameter memory 122 during start-up. RAM 126 is used for storing digital data for write operations and for storing digital data that has been generated as a result of a read operation. Disk control 124 includes various logic and bus arbitration circuitry used to properly interface disk drive mass storage system 130 to host 132 and for internally interfacing control circuitry 111 to SSD channel 110. Depending on the circuit implementation, any of a variety of circuitry may be used in disk control 124. Control circuitry 111 is also responsible for generating the various control and enable signals of disk drive mass storage system 130.

FIG. 4 is block diagram illustrating one example of read channel 118 incorporating linear transconductance circuit 10. It should be noted that the implementation of read channel 118, as illustrated in FIG. 4, is only one embodiment of a read channel and that the present invention is not limited to any one particular type or arrangement of read channel.

Read channel 118, in the one embodiment of FIG. 4, includes a variable gain amplifier (VGA) 142, an automatic gain control circuit (AGC) 144, a filter 146, a sampler 148, a phase locked loop (PLL) 150, a discrete signal equalizer 152, a detector 154, and recirculating delay-locked loop 210 serving as a time-base generator for read channel 118. Each of these portions of read channel 118 cooperate to receive and process a read signal from preamplifier 114 and disk/head assembly 112 during a read operation and generate an outbound digital data signal in response.

Read channel 118 receives the read signal at VGA 142 where the signal is amplified by an amount that is controlled by AGC 144 to generate an amplified read signal. VGA 142, along with AGC 144, work together to provide an appropriate amplification or gain to the analog read signal. AGC 144 receives a feedback signal from the output of filter 146 so that appropriate adjustments can be made in the amplification or gain provided to the read signal by VGA 142.

The amplified read signal is then provided by VGA 140 to filter 146 for further processing. Filter 146, in one embodiment, filters the signal to remove unwanted high frequency noise and thus is implemented as a low pass filter. The filtered read signal of filter 146 is provided to sampler 148. Filter 146 may also provide waveform shaping with amplitude boost. For example, filter 146 may be a continuous-time 7th order filter designed using Gm/C components. The cutoff frequency and boost of filter 146 may be programmable.

According to the invention, in an embodiment in which a 7th order filter is used, filter 146 includes a capacitor or a number of capacitors in parallel with fourteen linear transconductance circuits 10 connected in series; however, any suitable number of transconductance circuits 10 may be used without departing from the scope of the present invention. Such an embodiment is depicted by transconductance system 210 and capacitor system 212. Two linear transconductance circuits 10 may be connected in series by connecting first current output node 16 of a first transconductance circuit 10 to first voltage input node 12 of a second transconductance circuit 10 and by connecting second current output node 18 of the first transconductance circuit 10 to second voltage input node 14 of the second transconductance circuit 10. The use of transconductance circuits 10 in filter 146 allows a greater linear range, which leads to a greater signal-to-noise ratio for filter 146.

Sampler 148 samples the filtered read signal from filter 146 and generates a discrete read signal having discrete values. Sampler 148 converts the filtered read signal from continuous-time to discrete-time. The filtered read signal is sampled synchronously at times that correspond to the various magnetic transitions stored on the magnetic or storage media of disk/head assembly 112. These magnetic transitions correspond to the data stored on disk/head assembly 112. Sampler 148 samples the signal and holds the value until the next sample occurs.

PLL 150 provides a sampling clock or signal to sampler 148 that controls when sampler 148 samples and holds the filtered read signal. Each discrete value of the discrete read signal corresponds to the value or amplitude of the filtered read signal at the time the signal is sampled by sampler 148. Sampler 148 may be implemented as a sample and hold circuit such as a circular sample and hold circuit that is time sequence multiplexed to discrete signal equalizer 152 so that the correct time sequenced value is presented to discrete signal equalizer 152.

Discrete signal equalizer 152 receives the discrete read signal from sampler 148 and generates an equalized read signal having discrete levels corresponding to the magnetic transitions on disk/head assembly 112. Discrete signal equalizer 152 may be implemented as an analog finite impulse response filter. The discrete read signal is equalized to the target function of detector 154.

Detector 154 receives the discrete read signal from discrete signal equalizer 152. Detector 154 analyzes the signal and generates the outbound digital signal corresponding to the data stored on disk/head assembly 114. In one embodiment, detector 154 may be a maximum likelihood detector or Viterbi detector implementing the Viterbi algorithm. Although not illustrated in FIG. 4, read channel 118 may also include a synchronization detection circuit and a deserializer to properly interface the outbound digital signal with bus 122.

Thus, it is apparent that there has been provided, in accordance with the present invention, a transconductance circuit that satisfies the advantages set forth above. Although an embodiment has been described in detail, it should be understood that various and numerous changes, substitutions, and alterations can be made herein without departing from the scope of the present invention. Other examples of changes, substitutions, and alterations are readily ascertainable by one skilled in the art and could be made without departing from the spirit and scope of the present invention as defined by the following claims.

What is claimed is:

1. A transconductance circuit for providing an approximate linear response, comprising:

a differential input operable to receive a transconductance circuit differential input voltage;

a differential output operable to provide a transconductance circuit differential output current;

a first, a second, and a third differential pair, each differential pair operable to receive a differential voltage, each differential pair connected to a current sink, the current sink connected to the first differential pair being operable to sink a current having a magnitude that is different from the magnitude of the current sunk by the current source connected to the second differential pair and the current sink connected to the first differential pair is also different from the magnitude of the current sunk by the current source connected to the third differential pair;

an offset and divider circuit operable to receive a differential voltage indicative of the transconductance circuit differential input voltage and in response provide a first differential voltage to the first differential pair, a second differential voltage to the second differential pair, and a third differential voltage to the third differential pair, the first, second, and third differential voltages each having different common-mode levels; and wherein the first, second, and third differential pairs produce the transconductance circuit differential output current at the differential output in response to receiving the first, second, and third differential voltages, respectively.

2. The transconductance circuit of claim 1, wherein the sum of the common-mode voltages of the second and third differential voltages is approximately equal to twice the common-mode voltage of the first differential voltage.

3. The transconductance circuit of claim 1, wherein the current sink connected to the second differential pair and the current sink connected to the third differential pair comprise separate current sinks each operable to sink a current having approximately the same magnitude and wherein the current sink connected to the first differential pair produce a current that is less than the current sunk by the current sinks connected to the second and third differential pairs.

4. The transconductance circuit of claim 3, wherein the current sink connected to the second differential pair is operable to sink a current that is approximately 1.32 times the current sunk by the current sink connected to the first differential pair.

5. The transconductance circuit of claim 1, and further comprising a buffer circuit operable to receive the transconductance circuit differential input voltage and generate, in response, a buffer circuit output signal in response for receipt by the offset and divider circuit.

6. The transconductance circuit of claim 1, wherein the differential input comprises first and second input nodes and further comprising a negative impedance converter operable to increase the impedance between the first and second input nodes.

7. The transconductance circuit of claim 1, wherein the differential output comprises first and second output nodes and further comprising a negative impedance converter connected between the first and second output nodes, the negative impedance converter operable to increase the impedance between the first and second output nodes.

8. The transconductance circuit of claim 1, wherein the offset and divider circuit comprises a plurality of resistors.

9. The transconductance circuit of claim 1, wherein the first, second, and third differential pairs each include a pair of bipolar junction transistors.

10. The transconductance circuit of claim 1, wherein the offset and divider circuit comprises a pair of current sinks operable to cause a constant voltage drop across a pair of resistors.

11. The transconductance circuit of claim 1, wherein:
the sum of the common-mode voltages of the second and third differential voltages is approximately equal to twice the common-mode voltage of the first differential voltage;
the current sink connected to the second differential pair and the current sink connected to the third differential pair comprise separate current sinks each operable to sink a current having approximately 1.32 times the magnitude of the current sunk by the current sink connected to the first differential pair;
the differential input comprises first and second input nodes and further comprising a negative impedance converter operable to increase the impedance between the first and second input nodes;
the differential output comprises first and second output nodes and further comprising a negative impedance converter connected between the first and second output nodes, the negative impedance converter operable to increase the impedance between the first and second output nodes;
the offset and divider circuit comprises a pair of current sinks operable to cause a constant voltage drop across a pair of resistors;

the first, second, and third differential pairs each include a pair of bipolar junction transistors; and
further comprising a buffer circuit operable to receive the transconductance circuit differential input voltage and generate, in response, a buffer circuit output signal for receipt by the offset and divider circuit.

12. A method for generating a circuit differential current output in a transconductance circuit, the method comprising the steps of:
receiving a circuit differential voltage input for the transconductance circuit;
providing a differential voltage input to each of a plurality of differential pairs to control, in part, a differential current generated by each differential pair, each differential voltage input having a different common-mode voltage level;
sinking current through each of the differential pairs to control the differential current generated by each differential pair, the magnitude of the current sunk through one of the differential pairs being different from the magnitude of the current sunk through at least one of the other differential pairs; and
combining the generated differential current from each of the plurality of differential pairs to produce a circuit differential current output from the transconductance circuit.

13. The method of claim 12, and further comprising the step of setting the relative magnitudes of the current sunk through each of the differential pairs and the relative magnitudes of the common-mode voltages of each of the differential voltages inputs such that the transconductance of the differential current output with respect to the differential voltage input is relatively constant over a range of differential input voltages.

14. A method for generating a circuit differential current output in a transconductance circuit, the method comprising the steps of:
receiving a circuit differential voltage input;
providing a differential voltage input to each of a plurality of differential pairs to control, in part, a differential current generated by each differential pair, each differential voltage input having a different common-mode voltage level;
sinking current through each of the differential pairs to control the differential current generated by each differential pair, the magnitude of the current sunk through one of the differential pairs being different from the magnitude of the current sunk through at least one of the other differential pairs; and
combining the generated differential current from each of the plurality of differential pairs to produce a circuit differential current output,
wherein the step of providing a differential voltage input to each of a plurality of differential pairs to control, in part, a differential current generated by each differential pair, comprising the steps:
providing a first differential voltage to a first differential pair, the first differential voltage having a first common-mode level;
providing a second differential voltage to a second differential pair, the second differential pair having a second common-mode level; and
providing a third differential voltage to a third differential pair, the third differential pair having a third common-mode level, the sum of the second and third common-mode levels being equal to approximately twice the first common-mode level.

15. The method of claim 14, wherein the step of sinking current through each of the differential pairs to control the differential current generated by each differential pair further comprises the steps of:
   sinking a first amount of current through the first differential pair;
   sinking a second amount of current through the second differential pair and sinking the second amount of current through the third differential pair, the second amount of current being greater than the first amount of current.

16. A mass storage disk drive comprising:
   a disk/head assembly operable to magnetically store data;
   a control circuitry operable to exchange digital data with a host; and
   a data channel operable to receive analog data signal from the disk/head assembly and exchange digital data signals with the control circuitry, the data channel comprising a read channel, the read channel operable to receive and process a read signal from the disk/head assembly during a read operation and to generate an outbound digital data signal in response, the read channel comprising a filter operable to filter selected frequencies of a signal within the read channel, the filter comprising at least one transconductance circuit, each transconductance circuit comprising:
      a differential input operable to receive a transconductance circuit differential input voltage;
      differential output operable to provide a transconductance circuit differential output current;
      a first, a second, and a third differential pair, each differential pair operable to receive a differential voltage, each differential pair connected to a current sink, the current sink connected to the first differential pair being operable to sink a current having a magnitude that is different from the magnitude of the current sunk by the current source connected to the second differential pair and the current sink connected to the first differential pair is different from the magnitude of the current sunk by the current source connected to the third differential pair;
      an offset and divider circuit operable to receive a differential voltage indicative of the transconductance circuit differential input voltage and in response provide a first differential voltage to the first differential pair, a second differential voltage to the second differential pair, and a third differential voltage to the third differential pair, the first, second, and third differential voltages each having different common-mode levels; and
      wherein the first, second, and third differential pairs produce the transconductance circuit differential output current at the differential output in response to receiving the first, second, and third differential voltages, respectively.

17. The mass storage disk drive of claim 16, wherein the filter is a low pass filter.

18. The mass storage disk drive of claim 16, wherein the sum of the common-mode voltages of the second and third differential voltages is approximately equal to twice the common-mode voltage of the first differential voltage.

19. The mass storage disk drive of claim 16, wherein the current sink connected to the second differential pair and the current sink connected to the third differential pair comprise separate current sinks each operable to sink a current having approximately the same magnitude and wherein the current sink connected to the first differential pair is operable to produce a current that is less than the current sunk by the current sinks connected to the second and third differential pairs.

20. The mass storage disk drive of claim 16, wherein the current sink connected to the second differential pair is operable to sink a current that is approximately 1.32 times the current sunk by the current sink connected to the first differential pair.

* * * * *